United States Patent
Huang et al.

[11] Patent Number: 6,033,173
[45] Date of Patent: Mar. 7, 2000

[54] AUTOMATED ACCESS METHOD AND DEVICE FOR USE WITH LEAD FRAME MAGAZINE END COVER PLATES DURING IC PACKAGING PROCESS

[75] Inventors: Chien-Rong Huang, Hsinchu; Shiue-Ru Wu, Pan Chiao; Yung-Chen Tsao, Yuan Lin; Chi-Pin Chen, Hsinchu, all of Taiwan

[73] Assignee: Industrial Technology Research Institute, Hsinchu, Taiwan

[21] Appl. No.: 08/998,677

[22] Filed: Dec. 29, 1997

[30] Foreign Application Priority Data

Aug. 11, 1997 [TW] Taiwan ................................. 86111445

[51] Int. Cl.[7] ............................................ B23P 19/00
[52] U.S. Cl. ............................ 414/266; 901/40; 29/743
[58] Field of Search ................................ 414/266, 940, 414/939; 901/40; 29/743

[56] References Cited

U.S. PATENT DOCUMENTS

| | | | |
|---|---|---|---|
| 4,627,785 | 12/1986 | Monforte | 901/40 |
| 5,033,783 | 7/1991 | Izumi et al. | 901/40 |
| 5,163,802 | 11/1992 | Poinelli | 414/940 |
| 5,456,570 | 10/1995 | Davis et al. | 901/40 |
| 5,697,658 | 12/1997 | Park | 29/743 |
| 5,720,010 | 2/1998 | Watanabe et al. | 901/40 |
| 5,735,200 | 4/1998 | Tomei et al. | 901/40 |
| 5,839,877 | 11/1998 | Kikuchi et al. | 901/40 |
| 5,848,933 | 12/1998 | Roberson, Jr. et al. | 414/940 |
| 5,860,208 | 1/1999 | Nomura | 29/743 |
| 5,867,897 | 2/1999 | Mimura et al. | 29/743 |
| 5,870,820 | 2/1999 | Arakawa et al. | 901/40 |
| 5,899,760 | 5/1999 | Ho et al. | 29/743 |

*Primary Examiner*—Douglas Hess
*Attorney, Agent, or Firm*—W. Wayne Liauh

[57] ABSTRACT

An automated access device for lifting and placing back the end cover plates of lead-frame magazine during IC packaging process. It includes: (a) a 3-axis robotic arm a plurality of single-axis robots, adapted to carry out a positioning by horizontal and vertical motions; (b) an end cover plate temporary storage shelf, adapted to temporarily store a plurality of end cover plates removed from the magazine; (c) a guiding mechanism, adapted to provide positioning assistance of the end cover plates; and a gripper mechanism, installed in each the robotic arm. The gripper mechanism includes: (i) a suction disc; (ii) a first driver adapted to drive the suction disc to adhere to the end cover plates (iii) a second driver adapted to adjust the position of the suction disc; and (iii) a fixture cylinder having a first gripper adapted to position and fix the end cover plates to assure correct positioning and prevent the end cover plates from dropping during the motion of the robotic arm.

10 Claims, 6 Drawing Sheets

AUTOMATED ACCESS METHOD AND DEVICE FOR USE WITH LEAD FRAME MAGAZINE END COVER PLATES DURING IC PACKAGING PROCESS

FIELD OF THE INVENTION

The present invention relates generally to an automated access method and device for use with lead-frame magazine end cover plates during IC packaging process, and more particularly to a device that can automatically access lead-frame magazine end cover plates during the IC packaging process in order to protect the lead-frame from being damaged or contaminated during transport, and to upgrade the extent of automation in the IC packaging process.

BACKGROUND OF THE INVENTION

During IC packaging processes, in order to prevent the lead-frame from dropping out due to the human errors in the magazine transporting process, or being contaminated by the dust, both of which will result in production loss, it is necessary to cover the protective end cover plates. But we also need to remove the end cover plates from the magazines before they are sent into the other feeding entrance of the packaging equipment so that the equipment can take the lead-frame out of the magazines in order to continue the packaging process.

Therefore, as far as the packaging automation is concerned, especially during the transfer of the lead-frame magazines between the various steps of the manufacturing process involving die binder and wire binder, the handling of the end cover plates is a very important issue.

Today's machinery of the in-line system of relevant IC packaging equipment regarding the handling methods of the magazine end cover plate can be classified in general into two kinds:

(1) Manually accessing the end cover plate from the magazines by the operators, ESEC of Switzerland is a representative firm. This method not only needs a lot of labor when it comes to removing and covering back the end cover plates, it also causes the system operation to be troublesome due to the temporary space for the end cover plates.

(2) Transporting the lead-frame directly without using the magazines, A.S.M. of U.S.A is a representative firm. This method has the disadvantage of lacking flexibility; furthermore, the lead-frames, which are made of elastic material, are subject to being stuck at by the transporting mechanism, and are not applicable to the production line with products having small quantity and large number of variety. Also, since they are not protected by the magazines, the welding line of the lead-frame are subject to damage and contamination; As a result, the yield is not high.

In light of the afore-mentioned problems, the present invention designs a method and device for use in the IC package process to automatically access and temporarily store the end cover plates of the magazines so as to protect the lead-frame in the magazines from being damaged or contaminated during the transporting process, and to attain the effect of raising the yield. Moreover, when the lead-frames are moved in and out of the magazines during the IC packaging process, the device disclosed in the present invention can automatically perform loading, unloading, and temporarily storing the end cover plate, so as to attain the efficacy of saving labor and reducing the temporary storing space required of the end cover plates as well as raising the extent of automation of the IC packaging process.

SUMMARY OF THE INVENTION

The primary objectives of the present invention are to provide an automated access method and device for the lead-frame magazine end cover plates for use in the IC packaging process, and to make use of a novel gripper mechanism having two-step action in cooperation with a software control during the magazine feeding of the IC packaging process to automatically remove the magazine end cover plate and place it in a temporary storage shelf in order to allow the magazines, which are loaded with lead-frames, to be involved in the wire binder operation. During the discharging process of the magazines, the present invention makes use of the gripper mechanism with a two-step action to take out the corresponding end cover plates from the temporary storage shelf and to again cover the magazines to continue the transporting of the magazines. In this way, it can protect the lead-frame from being damaged or contaminated during the transporting process in order to upgrade the extent of automation in IC packaging process.

The present invention will be described in detail with reference to the drawing showing the preferred embodiment of the present invention, wherein:

BRIEF DESCRIPTION OP THE DRAWINGS

DETAILED DESCRIPTION OF PREFERRED EMBODIMENTS

Figure 1A:
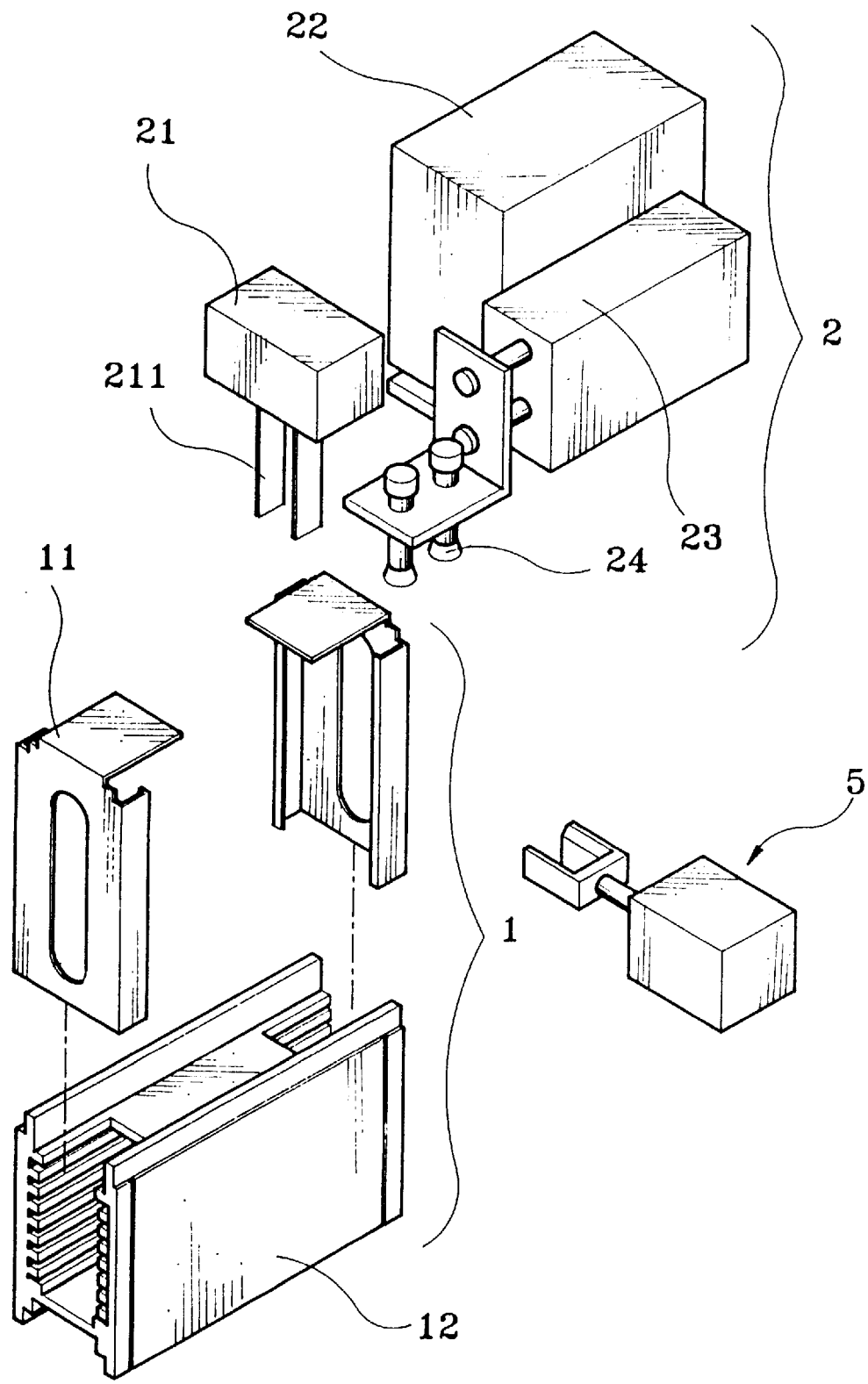
FIG. 1A is a schematic diagram of the gripper mechanism and the magazines of the preferred embodiment of a present invention.

The gripper mechanism 2 as shown in FIG. 1A comprises a first driver 22, a second driver 23, a suction disc 24, which makes use of the method of vacuum air suction, and a fixture cylinder 21 which has a set of first gripper 211. The magazine 1 includes the magazine main body 12, end cover plate 11, and a guide mechanism 5 used to assist positioning.

Figure 1D:
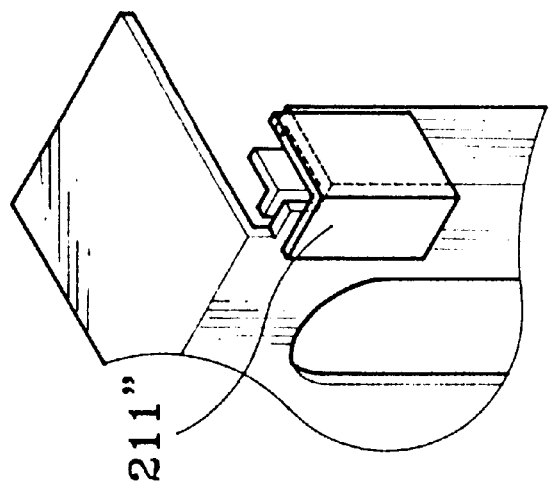
FIG. 1B through FIG. 1D are illustrative diagrams showing the relative locations of the fixtures and the end cover plates of a preferred embodiment of the present invention.
Figure 1C:
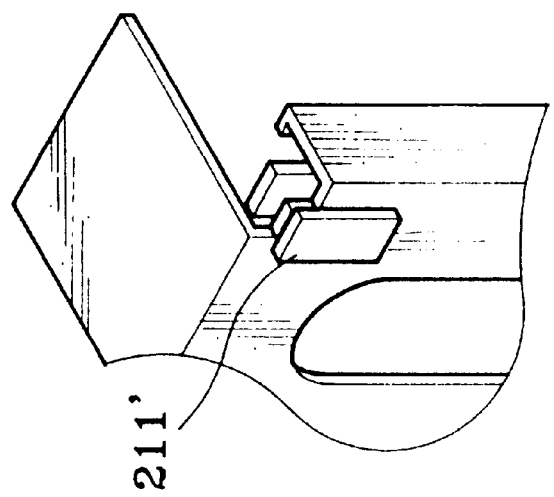
Figure 1B:
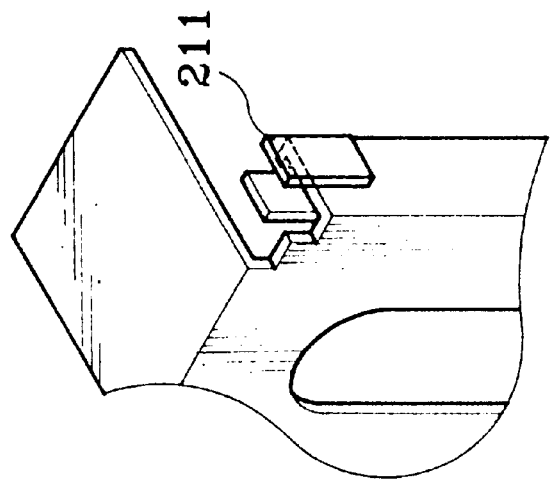

FIG. 1B through FIG. 1D shows the relative locations of the fixtures and the end cover plates of the preferred embodiment of the present invention. There are the three ways of clipping the end cover plate 11. The first gripper 211 as shown in FIG. 1B is to clip the first side of an end of the end cover plate 11 to attain the efficacy of fixing the end cover plate 11. It can also use the second gripper 211' as shown in FIG. 1C to clip and tightly press the second side which is perpendicular to an end of the end cover plate 11. Another way is to use the third gripper 211" as shown in FIG. 1D to clip and tightly press the comer where the first and second sides meet of an end of the end cover plate 11.

Figure 2:
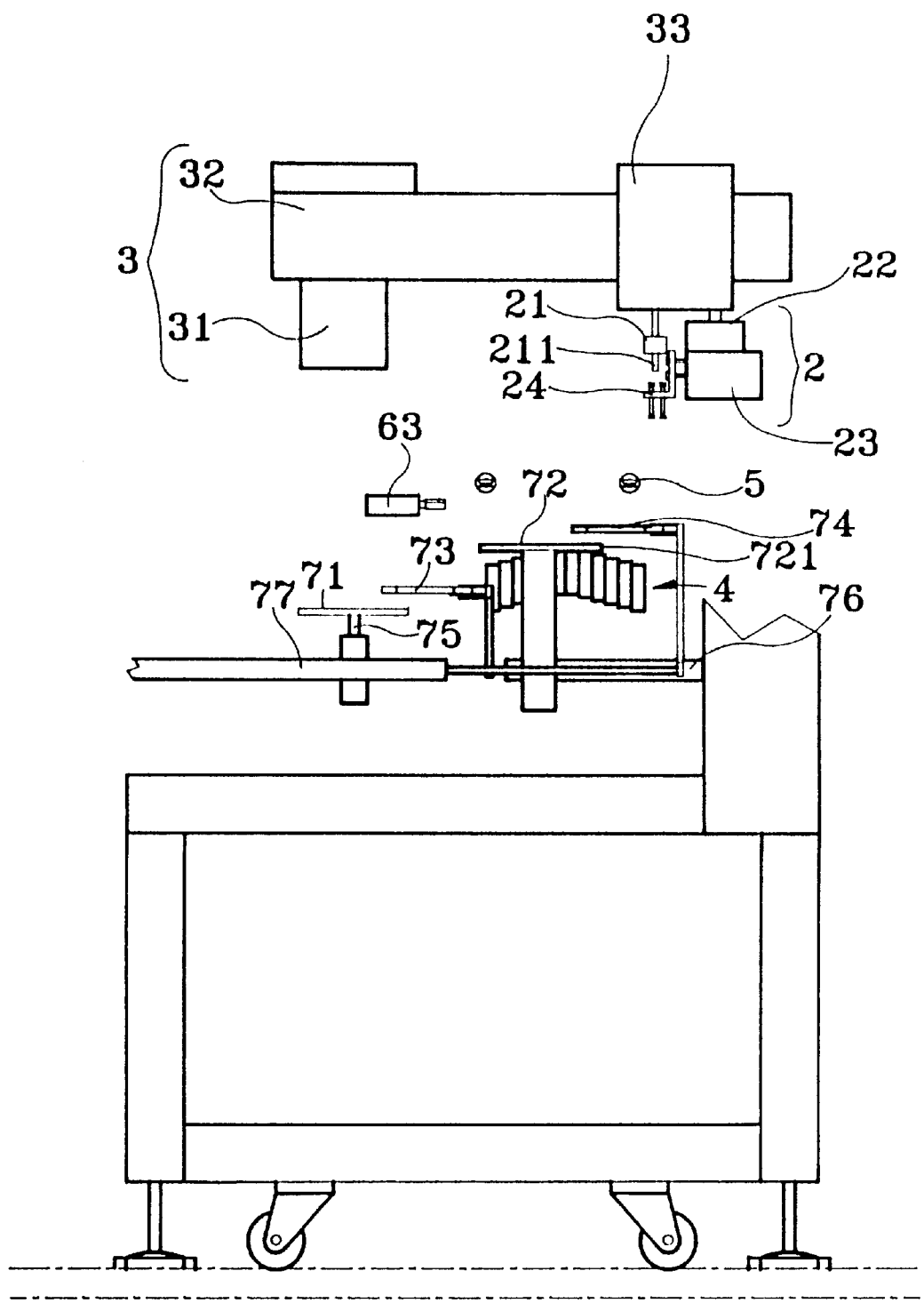
FIG. 2 is a schematic front view of the automated access device of the preferred embodiment of the present invention.
Figure 3:
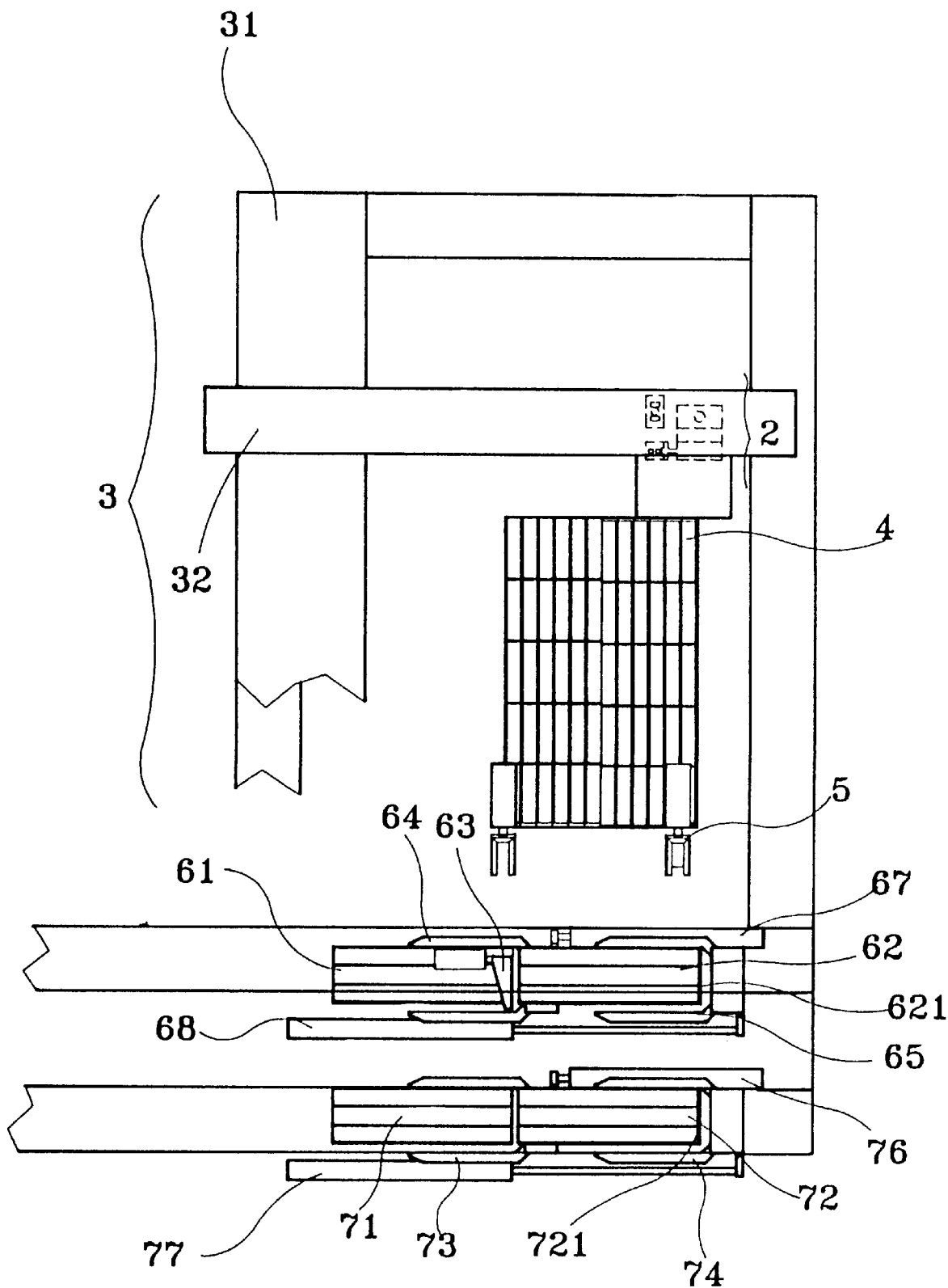
FIG. 3 is a schematic top view of the automated access device of the preferred embodiment of the present invention.

The automated access device as shown in FIG. 2 and FIG. 3 comprises: a set of 3-axis robotic arm 3 which is consisted of a single-axis robot 31 in the x-axis direction, a single-axis robot 32 in the y-axis direction, and a single-axis robot 33 in the z-axis direction, in a Cartesian coordinate system. An end cover plate temporary storage shelf 4 in the shape of a ladder is used to store the end cover plate 11; and a guide mechanism 5 is used to assist positioning. FIG. 3 also shows an end cover plate temporary discharge area 61, end cover plate send-back working area 62, send-back working area stop plate 621, positioning cylinder 63, first fixture 64, second fixture 65, first horizontal cylinder 67 and second horizontal cylinder 68; end cover plate feeding temporary storage area 71, end cover plate take-out working area 72, take-out working area stop plate 721, third fixture 73, fourth fixture 74, third horizontal cylinder 76 and fourth horizontal cylinder 77.

The 3-axis robotic arm 3 is a positioning mechanism to drive the gripper mechanism 2 in order to carry out horizontal and vertical motions, and the positioning mechanism for the horizontal motion of the 3-axis robotic arm 3 can be constituted by two sets of single-axis robotic arms in radial and angular directions respectively in a cylindrical coordinate system, while the positioning mechanism for the vertical motion is a single-axis robotic arm in z-direction, in cylindrical coordinate system.

The foregoing ladder shaped end cover plate temporary storage shelf 4 makes the end cover plates 11 partially overlapping each other when they are temporarily stored, in order to reduce the required space for the temporary storage. As a result, the present invention is able to attain the efficacy of saving the space and to resolve the management problem of the end cover plates.

Figure 4:
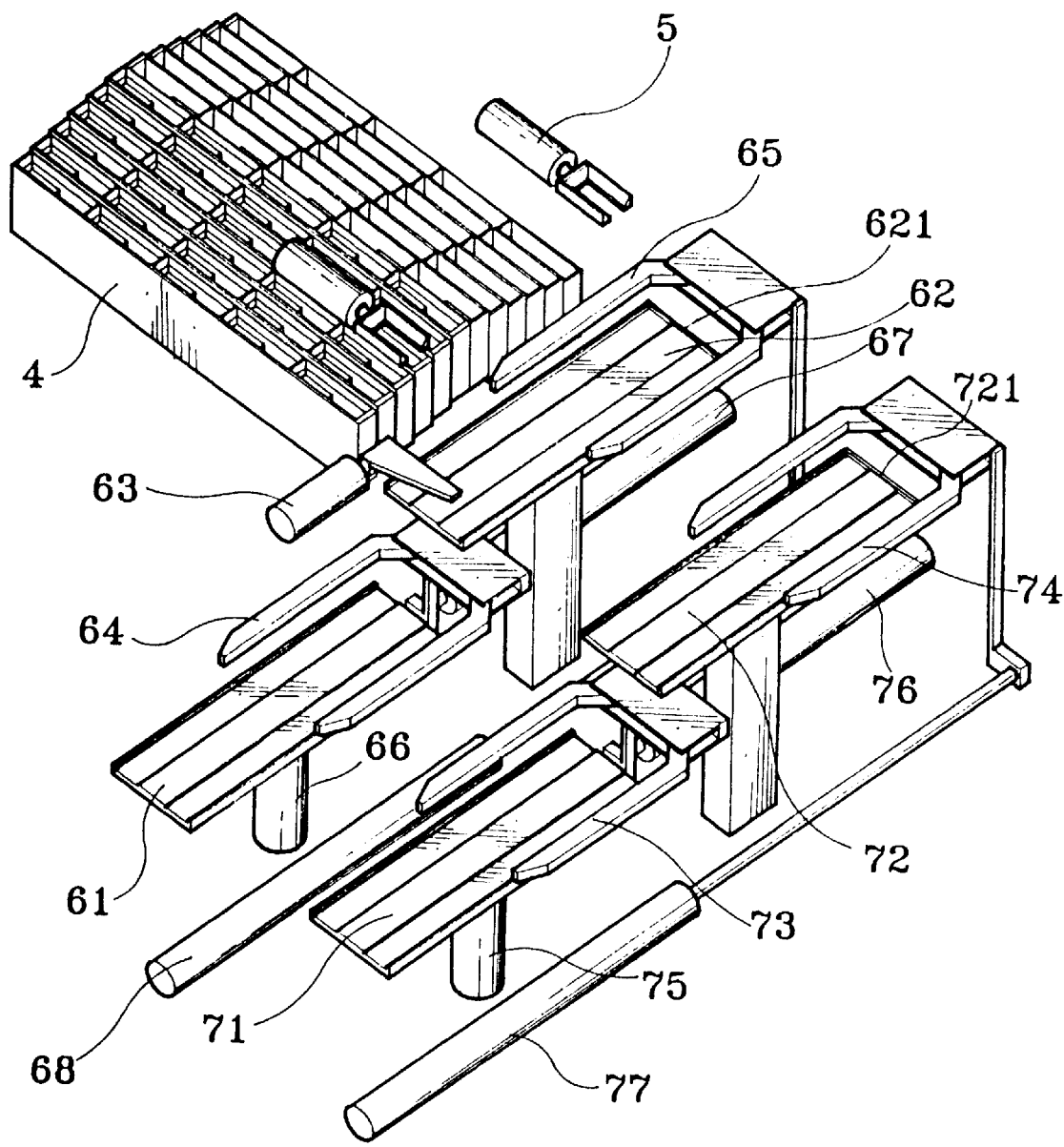
FIG. 4 is a partial pictorial view of the automated access device of the preferred embodiment of the present invention.

FIG. 4 illustrates generally a partial pictorial view of the automated access device of the preferred embodiment of the present invention, and more particularly to a pictorial schematic diagram while the magazines 1 are transported to access the present device.

First of all, let's introduce the action flow path when the magazines 1 are fed into the present device. After the magazines 1 are sent to a fixed position, the third horizontal cylinder 76 pushes the third fixture 73 to pick up the magazines 1 and guide them back to the end cover plate feeding temporary storage area 71. The third fixture 73 releases the magazines 1, and the second vertical cylinder 75 pushes the end cover plate feeding temporary storage area 71 and the magazines 1 upward toward the location where it is parallel to the end cover plate take-out working area 72; the fourth horizontal cylinder 77 pushes the fourth fixture 74 to pick up magazines 1 and guide them to the end cover plate take-out working area 72 from the end cover plate feeding temporary storage area 71 until the magazines 1 touch the take-out working area stop plate 721 to release the fourth fixture 74. Thereafter, it can carry out the operation of taking out the end cover plates 11, then sending into the feeding inlet of another packaging equipment.

As shown again in FIG. 4, the output action flow path of the magazines 1 is as follows: after the magazines 1 complete the process of another packaging equipment, they are sent to the end cover plate send-back working area 62, and the positioning cylinder 63 pushes the magazines 1 to make it contact the send-back working area stop plate 621 and start to carry out the work of sending back the end cover plates 11. After the end cover plates 11 are put back to the magazines 1, the first vertical cylinder 66 pushes the end cover plate discharge temporary storage area 61 until it is parallel to the end cover plate send-back working area 62. The second horizontal cylinder 68 drives the second fixture 65 to pick up magazines 1 and guide them to the end cover plate discharge temporary storage area 61; the second fixture 65 releases the magazines 1, then the first vertical cylinder 66 drives the end cover plate discharge storage area 61 back to the original position to facilitate the first horizontal cylinder 67 to drive the first fixture 64 to pick up the magazines 1, transport them to the next process equipment or transporting device.

Figure 5A:
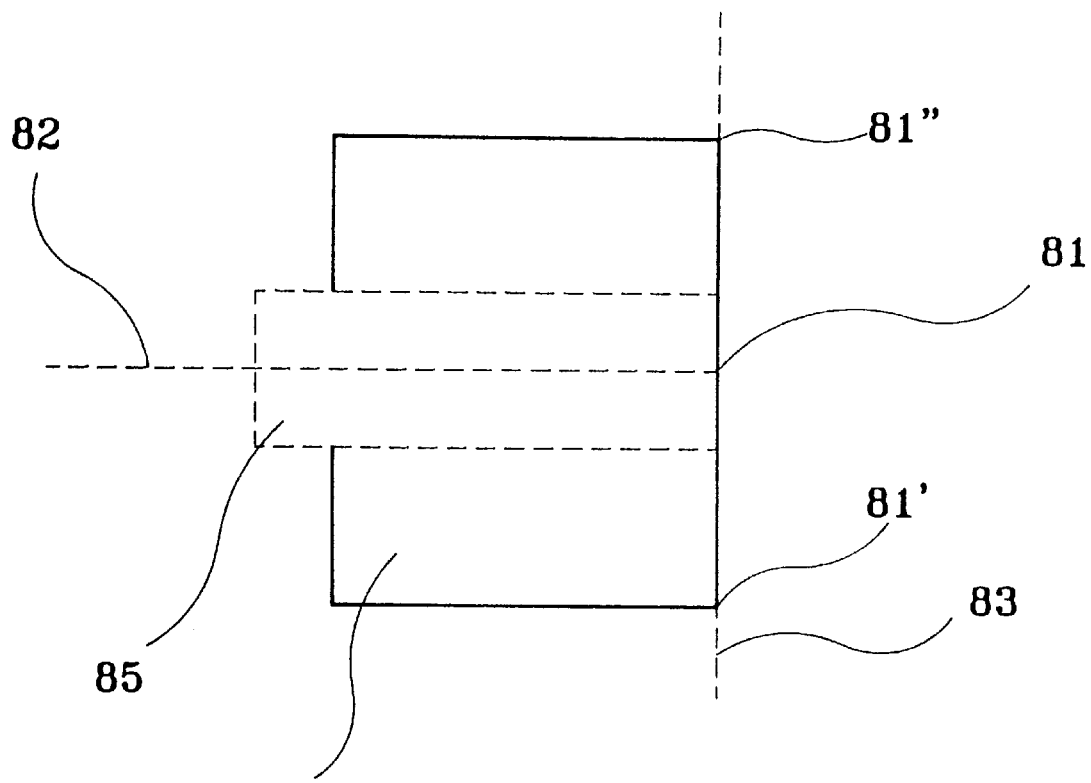
FIG. 5A is a schematic diagram of the positioning reference location of the magazines in different dimensions as the end cover plates placing back and taking out of the working area of the preferred embodiment of the present invention.

As shown in FIG. 5A, the schematic diagram of the positioning reference location of the magazine in different dimensions as the end cover plates placing back and taking out of the working area of the preferred embodiment of the present invention. Since the length and width dimensions of magazines 1 and end cover plates 11 have tens of different types in order to load lead-frame of a variety of types but the height has a unique criterion, i.e., the magazines 1 must be positioned accurately in order to take out or cover back the end cover plates 11 smoothly. Therefore, in order to adapt to the multiplicity of dimensions of the magazines 1 and end cover plates 11, the positioning mechanism uses one side of the lengthwise direction of the magazines 1 to be right-hand adjusted in accordance with the side adjusted line 83 while the width wise direction uses the center adjusted line 82 to align at the center. In this way, it makes the magazine of the first kind 84 and magazine of the second kind 85 having different dimensions to have the same first positioning datum point 81. Then, use the software to calculate the location of accessing the end cover plate 11. Similarly, one can also use the second positioning datum point 81' or the third positioning datum point 81" to be the reference location of alignment.

Figure 5B:
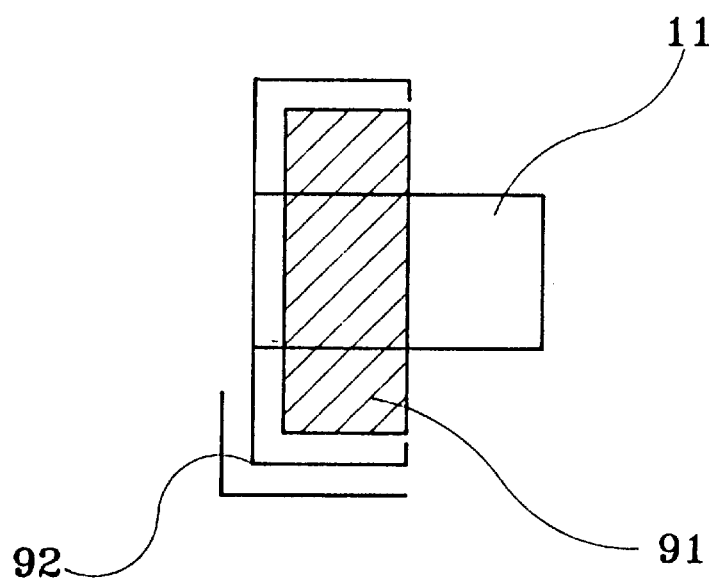
FIG. 5B is a schematic diagram of the positioning guide slot in the end cover plates' temporary storage shelf of the preferred embodiment of the present invention.

As shown in FIG. 5B, which shows a schematic diagram of the positioning guide slot in the temporary storage shelf for the end cover plates of the preferred embodiment of the present invention, as far as a variety (dimension, material etc.) of end cover plates 11 are concerned, since the strength of the top cap of the end cover plates 11 is not high enough and their relevant dimensions and shapes are quite different, it is not adequate to be a positioning datum location, while the fixed corner of the side of the end cover plate 11 which has the same shape and relatively large tolerance toward the error. Therefore, it is chosen to be the four positioning datum point 92. Moreover, in FIG. 3 and FIG. 4, there is a positioning placing block 91, which is a cubic block having a perpendicular angle, fixed and protruded on the plane of temporary storage lattice and formed a positioning guide slot together with frame side of the temporary storage lattice, installed at each of the temporary storage lattice of the end cover plate to facilitate the gripper mechanism 2 to precisely and smoothly to take out or place the end cover plate 11 in the temporary storage lattice.

Furthermore, since the present invention employs the fixed corner of the end cover plate 11 to be the positioning reference location and reserve beforehand a sufficient space to meet the requirements of a variety of dimensions of magazines 1 and end cover plates 11, one needs only to add a new magazine 1 type of data base (e.g. magazine of the first kind 84 and magazine of the second kind 85) in the software to be able to make use of the clip-claw mechanism 2 in coordination with the first positioning datum point 81, the second positioning datum point 81' and the third positioning datum point 81" to automatically access the new type of end cover plate 11, further to place the end cover plate 11 in the temporary storage lattice in accordance with the fourth positioning datum point 92. Therefore, the device of the present invention has the advantage of high extensibility.

As shown in FIG. 1A, the end cover plates 11 at the front and rear end of the magazine main body 12 are used to protect the lead-frame loaded in the magazine main body 12 during the transporting of the IC packaging process. The z-axis single-axis robot 33 of the gripper mechanism is acted as the positioning mechanism for vertical motion as shown in FIG. 2 and FIG. 3 to take out of and cover back to the end cover plate 11 where the first driver 22 and the fixture cylinder 21 are fixed to the z-axis single-axis robot 33 while the second driver 23 is connected to the first driver 22 and the suction disc 24 is connected to the second driver 23. The function of the first driver 22 is to drive the second driver 23 and suction disc 24, to carry out vertical motion to suck the end cover plates 11 so as to separate the end cover plate 11 from the magazine main body 12 and to guide the end cover plates into the first gripper 211 of the fixture cylinder 21. Thereafter, the fixture cylinder 21 will tightly clip and fix the end cover plate 11 to avoid the dropping of the end cover plate 11 in the 3-axis robotic arm 3 during the transporting process. It also makes use of the fixture cylinder 21 to tightly clip and fix the end cover plates 11 in order to keep it without shaking to assure the stability of positioning. The first driver 22 takes the suction disc 24 adhered with the end cover plate 11 to cover back to the magazine main body 12 through the auxiliary positioning of the guide mechanism 5 while the second driver 23 is used to adjust the position of the suction disc 24 to fit the end cover plates 11 at the front or rear end of the magazine main body 12. The function of the foregoing fixture cylinder 21 is to position and fix the end cover plates 11 to assure the correct positioning and to avoid the end cover plates 11 from dropping during the transporting motion of the 3-axis robotic arm 3.

The aforementioned second driver 23, which is used to adjust the suction plate 24, and the first driver 22, which is used to drive the second driver 23 and the suction plate 24 in order to perform vertical motions, can be constituted by cylinders or screw bolt and driving motor etc.

Let's describe the motion sequence of the automated access device of the magazines' end cover plate of the IC packaging process as follows:

As shown in FIG. 2, FIG. 3, and FIG. 4, firstly, the magazines 1 loaded with end cover plates 11 are sent to the end cover plate feeding temporary storage area 71. Then, by the use of the first positioning datum point 81 as shown in FIG. 5A as the positioning datum, take the magazines 1 from the end cover plate feeding temporary storage area 71 and bring it to the end cover plate take-out working area 72. Then, as shown in FIG. 5A, in accordance with the positioning datum point 81 in the feeding direction of the magazines 1 to accurately position the magazines 1, then, by the use of the 3-axis robotic arm in Cartesian coordinate system to drive the gripper mechanism 2 installed at the z-axis single-axis robot 33 to clip the end cover plates 11 from the magazines 1, in the mean time, to send the end cover plates 11 to the end cover plate temporary storage shelf 4 to be stored temporarily, thus, to complete the feeding action of magazines 1, waiting the other device to take away the magazine main body 12 in order to perform the next IC packaging process.

After completing the next IC packaging process such as the wire bonding of the lead-frame, the magazines 1 are sent back to the end cover plate send-back working area 62 to precisely position the magazines 1 in accordance with the first positioning datum point 81 of the discharging direction of the magazines 1 as shown in FIG. 5A. Accordingly, the 3-axis robotic arm 3 drives the gripper mechanism 2 of the single-axis robot 33 installed in z-axis direction to clip and take the end cover plates 11 which are corresponding with the magazines 1. One can also refer to FIG. 1A to complete assembling the end cover plates 11 and magazines 1, then, accomplishing the discharging action of the magazines by transporting the magazines 1 from the end cover plate send-back working area 62 to the end cover plate discharging temporary storage area 61.

As shown in FIG. 1A, the action of the gripper mechanism 2 to clip and pick up the end cover plates 11 is divided into two stages. Making use of the suction disc 24 to separate the end cover plates 11 from the magazine main body 12 is the first stage and, making use of the fixture cylinder 21 to position and fix the end cover plates 11 is the second stage. Here are the methodic steps:

(1) By the use of the 3-axis robotic arm 3 to drive the gripper mechanism 2 installed in the single-axis robot 33 in the z-axis direction, and based on the first positioning datum point 81 as shown in FIG. 5A as the positioning datum to move to the location above the end cover plate 11 intended to clip and take;

(2) Adjust the second driver 23 in order to drive the suction disc 24 to extend or retreat to adapt to the end cover plate 11 at the front or rear end of the magazine main body 12;

(3) The first driver 22 extends downward to drive the second driver 23 and suction disc 24 to move downward until the suction disc 24 touches the top cap of the end cover plate 11, then, the vacuum aspirating system begins to aspirate air to make the suction disc 24 adhere the end cover plate 11;

(4) The fixture cylinder 21 starts to act to make the first gripper 211 open, then, the first driver 22 retreats upward to separate the end cover plate 11 from the magazine main body 12, in the mean time, to guide the side of the end cover plate 11 into the first gripper of the fixture cylinder 21;

(5) The single-axis robot 33 in the z-axis direction of the 3-axis robotic arm 3 ascends to drive the end cover plate 11 to move upward until it completely separates from the magazine main body;

(6) The fixture cylinder 21 drives the first gripper 211 to close and clip at one side of the end cover plate 11 in order to position and fix the end cover plate;

(7) The 3-axis robotic arm 3 starts to move to transport the end cover plate to the position intended to place.

During the foregoing action of clipping the end cover plate 11 in steps (4) and (5), there is a relative motion and friction between the end cover plate 11 and the magazine main body 12, but it is the flexibility and adaptability of the suction disc 24 that makes the friction effect between them reduced to avoid generating the so-called micro-dust to attain the effect of protecting the clean room from being contaminated.

The methods and steps of the action of placing the end cover plate 11 of the gripper mechanism are as follows:

(1) The 3-axis robotic arm 3 starts to move to send the end cover plate 11 to the position intended to place using the fourth positioning datum point 92 as shown in FIG. 5B as the positioning datum;

(2) After positioning, the fixture cylinder 21 activate to make the first gripper 211 open, then, the single-axis robot 33 in z-axis of the 3-axis robotic arm 3 descends slowly to make the side of the end cover plate 11 that is not clipped by the first gripper 211 slips into the guiding mechanism 5;

(3) The single-axis robot 33 in z-axis direction of the 3-axis robotic arm 3 continues to descend slowly until the end cover plates 11 inserts into the end cover plate temporary storage shelf 4 or magazine main body 12 through the positioning assistance of the guiding mechanism 5;

(4) The first driver 22 drives the suction disc 24, adhering with the end cover plate 11, extends downward to place the end cover plate 11 into the end cover plate temporary storage shelf 4 or to complete assembling with the magazine main body 12;

(5) To shut down the vacuum air aspirator in order to let the air pressure comes back to the state of atmosphere so as to make the suction disc 24 stop adhering the end cover plates 11, then, the first driver 22 drives the suction disc 24 to retreat upward.

During the foregoing action of placing the end cover plates 11, again, it makes use of the flexibility and adaptability of the suction disc 24 in steps (2), (3), (4) to reduce the friction between the end cover plates 11 and temporary storage shelf 4 or magazine main body 12.

Therefore, the automated access and storage method and device involving the end cover plate of the IC packaging process of the present invention makes use of the magazines 1 to protect the lead-frame loaded in them from being damaged or contaminated by the micro-dust during the transporting process to attain the effect of raising the yield. It also provides a of gripper mechanism 2 with a two-step-action before the lead-frame accessing the magazines 1 during the packaging process to automatically perform loading and unloading and temporarily storing the end cover plate 11 where one of the steps of the action is to take down and assemble the end cover plates 11 from and into the magazines 1 by the suction disc 24 and to reduce the friction between the end cover plates 11 and magazine main body 12 by making use of the flexibility and adaptability of the suction disc 24 to avoid the generation of micro-dust due to the friction, thereby, to attain the effect of preventing the clean room from being contaminated. The other step of the two-step-action is to position and fix the end cover plate by the fixture cylinder 21 having the guiding and tightly clipping function to prevent the end cover plates 11 from dropping during the transporting process, it can also precisely place them in fixed position in order to raise the extent of automation in the IC packaging process.

Although the present invention has been illustrated and described previously with reference to the preferred embodiments thereof, it should be appreciated that it is in no way limited to the details of such embodiments, but is capable of numerous modifications within the scope of the appended claims.

What claimed is:

1. An automated access device for use with lead-frame magazine end cover plates during IC packaging process, to automatically load and unload as well as temporarily store the end cover plates of the magazine loaded with lead-frames, comprising:

a 3-axis robotic arm and a plurality of single-axis robots, adapted to carry out a positioning by horizontal and vertical motions;

an end cover plate temporary storage shelf, adapted to temporarily store a plurality of end cover plates removed from the magazine;

a guiding mechanism, adapted to provide positioning assistance in placing the end cover plate in said end cover plate temporary storage shelf or back to said magazine;

a gripper mechanism, installed in said robotic arm for removing and putting back to said end cover plate with respect to said magazine, said gripper mechanism comprising:

a suction disc;

a first driver adapted to drive said suction disc to adhere to said end cover plates so as to separate them from said magazine, and to return said end cover plates back to said magazine through a positioning assistance of said guiding mechanism;

a second driver adapted to adjust a position of the suction disc so as to adapt to the different directions of said end cover plates; and a fixture cylinder having a first gripper adapted to position and fix said end cover plates to assure correct positioning and prevent the end cover plates from dropping during the motion of said robotic arm.

2. An automated access device for use with lead-frame magazine end cover plates during IC packaging process of claim 1, wherein said end cover plate temporary storage shelf comprises a plurality of temporary storage lattices arranged in a stepped manner so as to allow said end cover plates to partially overlap one another when they are stored in the temporary storage space and reduce the overall height required of the temporary storage space.

3. An automated access device of magazines' end cover plates of IC packaging process of claim 2, wherein each of said temporary storage lattice of said end cover plates has a positioning placing block used to guide and position said end cover plates, and has a plane making a perpendicular angle with and protruded from and fixed to said temporary storage lattice, and said plane forms together with a side frame of said temporary storage lattice, a position which can exactly match the sides of said end cover plates in order to assist said gripper mechanism to precisely take out or place said end cover plates in said temporary storage lattice.

4. An automated access device of magazines' end cover plates of IC packaging process of claim 3, wherein said end cover plate temporary storage shelf uses a fixed corner of a side of said end cover plates as a positioning reference location and to set up said positioning placing block based on said positioning reference location to accept different types of said end cover plates of said magazines.

5. An automated access device of magazines' end cover plates of IC packaging process of claim 1, wherein the positioning of the horizontal motion of said 3-axis robotic arm is carried out by a plurality of single-axis robots in x-axis and y-axis directions in Cartesian coordinates, and the positioning of the vertical motion is carried out by a single-axis robot in z-axis direction in Cartesian coordinates.

6. An automated access device of magazines' end cover plates of IC packaging process of claim 1, wherein the positioning of the horizontal motion of said 3-axis robotic arm is carried out by a plurality of single-axis robots in radial and angular directions in cylindrical coordinates, and the positioning mechanism of the vertical motion is a single-axis robot in z-axis direction in cylindrical coordinates.

7. An automated access device of magazines' end cover plates of IC packaging process of claim 6, wherein said first driver and said fixture cylinder are fixed to the single-axis robot in z-direction, said second driver is connected to said first driver while said suction disc is connected to said second driver; the function of said first driver is to drive said second driver and said suction disc to carry out motion in vertical direction to adhere said end cover plates in order to separate them from a magazine main body and to guide them into said gripper of said fixture cylinder, then, said fixture cylinder tightly clips and fixes said end cover plates to avoid dropping during the course of motion of said robotic arm; also to fix said end cover plates by the use of said fixture cylinder to keep it stable in assuring positioning without shaking, said first driver drives said suction disc adhered with said end cover plates, through the positioning assistance of said guiding mechanism, to push said end cover plates to cover back to said magazine main body; while said second driver carries out horizontal motion in order to adjust the position of said suction disc to adapt to said end cover plates located at the front or rear end of said magazine main body.

8. An automated access device of magazines' end cover plates of IC packaging process of claim 1 wherein said first driver and said second driver can be constituted by transmission mechanisms such as a cylinder or a screw bolt with a driving motor.

9. An automated access device of magazines' end cover plates of IC packaging process of claim 1 wherein said fixture cylinder possesses a set of grippers used to clip said end cover plates to assure precise positioning and to prevent said end cover plates from dropping during the motion of said robotic arm.

10. An automated access device of magazines' end cover plates of IC packaging process of claim 1 wherein said suction disc make use of the way of vacuum air expiration to adhere flexible adhering elements of said end cover plates.

* * * * *